United States Patent
Yuasa et al.

(10) Patent No.: US 6,737,812 B2
(45) Date of Patent: May 18, 2004

(54) PLASMA PROCESSING APPARATUS (75) Inventors: Mitsuhiro Yuasa, Tokyo (JP); Koji Homma, Higashiyamato (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/192,564

(22) Filed: Jul. 11, 2002

(65) Prior Publication Data

US 2003/0057848 A1 Mar. 27, 2003

(30) Foreign Application Priority Data

Sep. 21, 2001 (JP) .................................. 2001-289013

(51) Int. Cl.[7] .............................................. H05B 31/26
(52) U.S. Cl. ............................ 315/111.71; 315/111.21; 156/345.33; 204/298.07
(58) Field of Search ................ 315/111.71, 111.41, 315/111.21, 111.31; 118/723 E, 723 ME, 715, 723 HC; 156/345.33, 345.34, 345.36, 345.35, 345.29; 134/1.1, 1.2, 1.3; 204/298.07

(56) References Cited

U.S. PATENT DOCUMENTS

| | | | | |
|---|---|---|---|---|
| 5,424,103 A | * | 6/1995 | Ahn | ................ 118/723 E |
| 5,560,777 A | * | 10/1996 | Ahn | ................ 118/723 E |
| 6,026,762 A | * | 2/2000 | Kao et al. | ................ 315/111.21 |
| 6,059,922 A | * | 5/2000 | Yamazaki et al. | ..... 156/345.37 |
| 6,352,050 B2 | * | 3/2002 | Kamarehi et al. | ... 118/723 ME |

FOREIGN PATENT DOCUMENTS

| | | |
|---|---|---|
| JP | 09027482 | 1/1997 |
| JP | 09115887 | 5/1997 |
| JP | 09199482 | 7/1997 |
| JP | 09213686 | 8/1997 |
| JP | 09246250 | 9/1997 |
| JP | 10147893 | 6/1998 |
| JP | 2000133639 | 5/2000 |

* cited by examiner

*Primary Examiner*—Don Wong
*Assistant Examiner*—Ephrem Alemu
(74) *Attorney, Agent, or Firm*—Pillsbury Winthrop LLP (57) ABSTRACT

A plasma processing apparatus processing a surface of a substrate by spraying a process gas in a plasma state from a gas spray opening of a spray nozzle onto the substrate includes: an exhaust opening for exhausting residual gas generated at the time of processing the surface of the substrate, the exhaust opening being provided at a position close to the periphery of the gas spray opening; and an air jet opening generating airflow, the air jet opening being provided surrounding the exhaust opening so as to prevent the residual gas from flowing out.

23 Claims, 9 Drawing Sheets

PLASMA PROCESSING APPARATUS

BACKGROUND OF THE INVENTION

1. Field of the Invention

The present invention generally relates to plasma processing apparatuses, and more particularly to a plasma processing apparatus that is configured to process the surface of a substrate by spraying a process gas in a plasma state from the gas spray opening of a spray nozzle onto the substrate.

2. Description of the Related Art

Dry etching is frequently employed for fine processing of a semiconductor substrate or a wiring layer in a process of manufacturing semiconductor elements, for instance. In dry etching, a plasma is created by microwaves, for instance, and a specimen is etched by ions or an excited gas generated thereby.

Therefore, in some cases, it becomes a problem that ionized particles collide with and damage the semiconductor substrate. Conventionally, in order to cope with this problem, only a type of gas capable of performing etching only through chemical action is extracted and introduced into an etching chamber through a transportation tube, and etching is performed by spraying the plasma etching gas from a spray nozzle onto the surface of the specimen.

For instance, a silicon wafer placed on a work holder is etched by spraying the etching gas from the spray nozzle thereonto. At this point, most of the exhaust gas generated at the time of etching and most of the unreacted (unused) part of the etching gas are introduced into a differential exhaust chamber provided in the periphery of the spray nozzle and are exhausted to the outside.

According to a plasma processing apparatus having the above-described configuration, however, the negative pressure of the differential exhaust chamber does not cause all of the exhaust gas and the etching gas to be introduced into the differential exhaust chamber, so that a residual gas composed of part exhaust gas and part unreacted etching gas may flow out to the surface of the wafer and into the etching chamber.

Therefore, in the conventional apparatus, the outflow of the residual gas generated at the time of etching into the etching chamber has caused the problems of reduction in the rate of etching and contamination and generation of dust in the etching chamber due to deposition of a reaction byproduct.

SUMMARY OF THE INVENTION

Accordingly, it is a general object of the present invention to provide a plasma processing apparatus in which the above-described disadvantages are eliminated.

A more specific object of the present invention is to provide a plasma processing apparatus avoiding the outflow to the surface of a wafer and into an etching chamber of residual gas generated at the time of processing, and having improved exhaust efficiency.

The above objects of the present invention are achieved by a plasma processing apparatus processing a surface of a substrate by spraying a process gas in a plasma state from a gas spray opening of a spray nozzle onto the substrate, the plasma processing apparatus including: an exhaust opening for exhausting residual gas generated at a time of processing the surface of the substrate, the exhaust opening being provided at a position close to a periphery of the gas spray opening; and an air jet opening generating airflow, the air jet opening being provided surrounding the exhaust opening so as to prevent the residual gas from flowing out.

According to the above-described plasma processing apparatus, the residual gas generated at the time of processing is sucked into the exhaust opening and at the same time, part of the residual gas which part has escaped being sucked into the exhaust opening is prevented from flowing outside to the surface of the substrate and into the etching chamber by the wall of air pressure formed by the airflow around the exhaust opening. Therefore, reduction in the rate of etching and contamination and generation of dust in the processing chamber due to the deposition of a reaction byproduct caused by the outflow of the residual gas into the processing chamber are prevented with certainty.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description will now be given, with reference to the accompanying drawings, of embodiments of the present invention.

Figure 1:
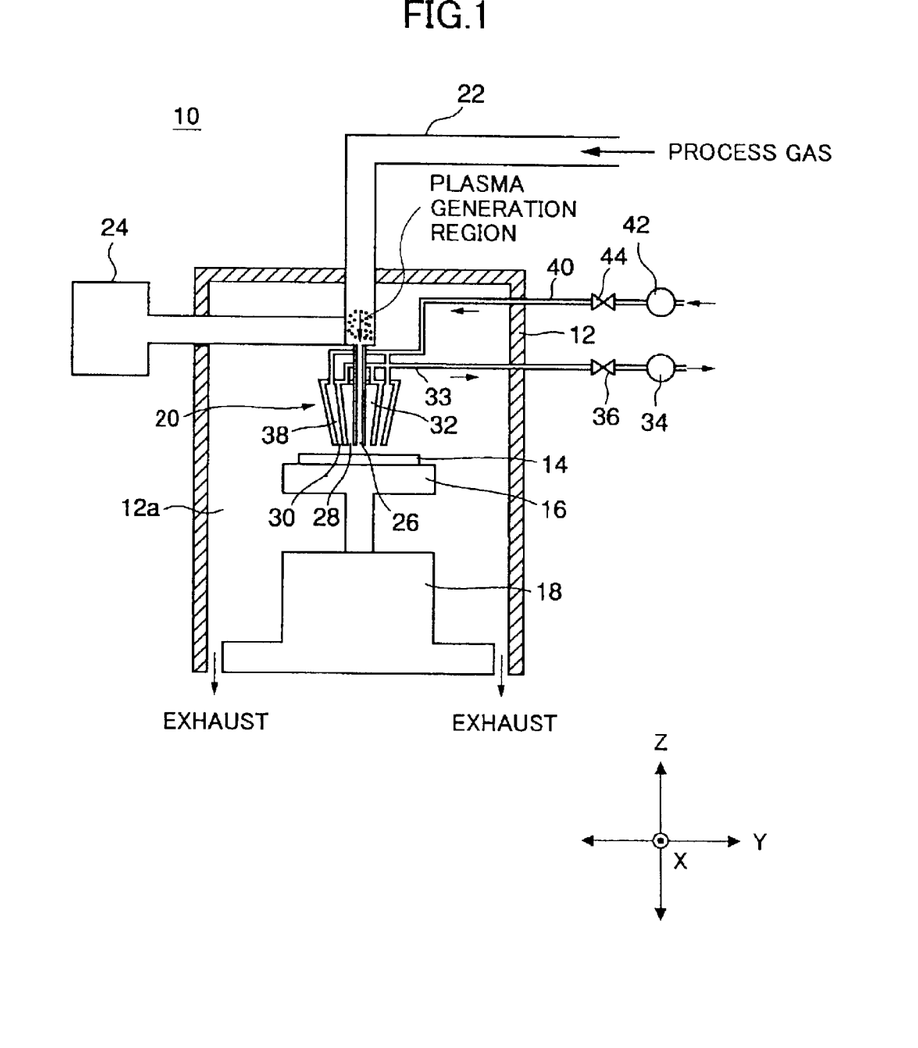
FIG. 1 is a diagram showing a plasma etching apparatus according to the present invention.

FIG. 1 is a diagram showing a plasma etching apparatus 10 according to the present invention.

As shown in FIG. 1, the plasma etching apparatus 10 as a plasma processing apparatus performs partial plasma etching by spraying a plasma etching gas onto part of a silicon (Si) wafer (substrate) 14. The plasma etching apparatus 10 includes a chamber 12 having an etching chamber (process chamber) 12a having a given low-pressure environment inside, an XYZ table 16 on which the Si wafer is' placed in the etching chamber 12a, a driving part 18 that moves the XYZ table 16 in the X, Y, and Z directions (or along the X-axis, Y-axis, and Z-axis), a nozzle 20 provided in the chamber 12 to oppose the Si wafer 14, a gas supply pipeline 22 for supplying a process gas to the nozzle 20, and a magnetron 24 that creates a plasma by subjecting the process gas flowing through the gas supply pipeline 22 to microwaves.

The chamber 12 has a gap formed around the driving part 18. The gap communicates with an exhaust part such as a vacuum pump (not shown in the drawing) so that the etching chamber 12a has the given low-pressure environment inside.

The process gas supplied through the gas supply pipeline 22 is formed of, for instance, a mixture of halide gas $NF_3$ and inert gas Ar, and is turned into a plasma by the microwaves from the magnetron 24 in the process of being supplied to the nozzle 20 via the gas supply pipeline 22. The etching gas plasma-enhanced by the microwaves is sprayed on the surface of the Si wafer 14 through a gas spray opening 26 provided in the center of the end face (lower face) of the nozzle 20.

The XYZ table 16 moves along the X-axis and the Y-axis (the front-rear and the right-left directions) on a horizontal plane so that the part of the Si wafer 14 placed on the XYZ table 16 which part opposes the gas spray opening 26 can be changed. That is, an etching point can be moved on the Si wafer 14. Further, the XYZ table 16 moves vertically along the Z-axis so that the distance between the Si wafer 14 and the gas spray opening 26 is adjusted.

On the end face of the nozzle 20, the gas spray opening 26 is formed in the center, an annular exhaust vent (exhaust opening) 28 is formed concentrically around the periphery of the gas spray opening 26, and an annular air jet opening 30 is formed concentrically around the periphery of the exhaust vent 28. An exhaust path 32 communicating with the exhaust vent 28 communicates with a vacuum pump 34 via a suction pipeline 33. When a valve 36 provided to the suction pipeline 33 is opened, the vacuum pump 34 sucks in gas in the suction pipeline 33 to generate negative pressure in the exhaust path 32, thereby collecting the residual gas generated at the time of etching from the exhaust vent 28 and exhausting the residual gas to the outside.

An air supply path 38 communicating with the air jet opening 30 communicates with an air supply pump 42 via an airline 40. Accordingly, when a valve 44 provided to the airline 40 is opened, air (gas for an air curtain) pumped from the air supply pump 42 is sprayed toward the surface of the wafer 14 from the air jet opening 30. The airflow jetted out from the air jet opening 30 serves as an air curtain to form a shield around the exhaust vent 28.

Thereby, the residual gas generated at the time of etching and existing in the space formed between the end face of the nozzle 20 and the surface of the Si wafer 14 is prevented from flowing out into the etching chamber 12a by the airflow (air curtain) jetted out from the air jet opening 30. Therefore, the exhaust gas generated at the time of etching and the unreacted etching gas are prevented from flowing into the etching chamber 12a, thereby avoiding reduction in the rate of etching and contamination and generation of dust in the etching chamber 12a due to the deposition of a reaction byproduct.

An inert gas such as nitrogen or argon (Ar) gas is employed as the air sprayed from the air jet opening 30. The airflow jetted out from the air jet opening 30 is not only employed as the air curtain but also functions as a stabilizer of the surface of the wafer 14 or the residual gas if oxygen ($O_2$), hydrogen ($H_2$), or Ar is used for the airflow. Further, the airflow jetted out from the air jet opening 30 may also be cooled down to have the cooling function of lowering temperature at the surface of the nozzle 20 or the Si wafer 14, or the temperature of the residual gas.

A description will now be given of configurations of the nozzle 20.

Figure 2A:
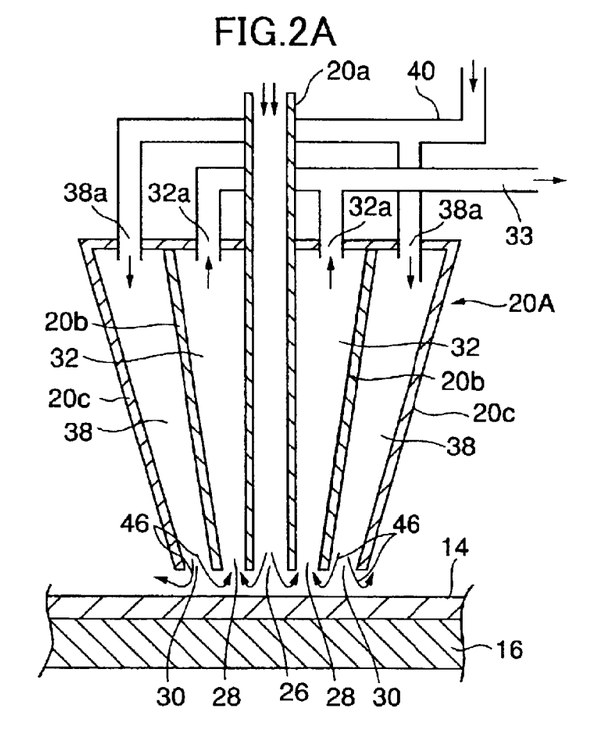
FIG. 2A is a longitudinal sectional view of a nozzle of the plasma etching apparatus of FIG. 1 according to a first embodiment of the present invention, showing the internal structure of the nozzle.
Figure 2B:
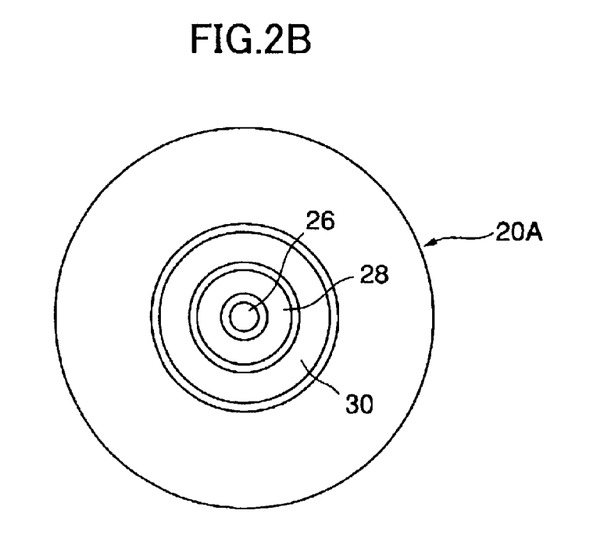
FIG. 2B is a bottom view of the nozzle of FIG. 2A, showing the shape of an end thereof.

FIGS. 2A and 2B are diagrams showing a nozzle 20A according to a first embodiment of the present invention. FIG. 2A is a longitudinal sectional view of the nozzle 20A, showing the internal structure thereof. FIG. 2B is a bottom view of the nozzle 20A, showing the lower end shape thereof.

As shown in FIGS. 2A and 2B, the nozzle 20A has the triple structure of an inner pipeline 20a communicating with the gas supply pipeline 22, a middle pipeline 20b forming the exhaust path 32, and an outer pipeline 20c forming the air supply path 38 that are concentrically formed.

Further, the gas spray opening 26 formed on the lower end of the inner pipeline 20a, the exhaust vent 28 formed on the lower end of the exhaust path 32, and the air jet opening 30 formed on the lower end of the air supply path 38 are arranged concentrically on the end face of the nozzle 20A which end face opposes the surface of the wafer 14.

As described above, the nozzle 20A has the annularly formed exhaust vent 28 provided close to the periphery of the gas spray opening 26. Therefore, the residual gas generated at the time of etching is efficiently sucked into the exhaust vent 28 and exhausted from the vacuum pump 34 to the outside of the chamber 12.

Further, the air jet opening 30 is formed annularly to surround the periphery of the exhaust vent 28. Therefore, airflow 46 for forming a shield (air curtain) around the exhaust vent 28 can be formed with efficiency. Since the airflow 46 is jetted out from the smaller diameter end of the tapered air supply path 38, the airflow 46 is accelerated while moving downward.

Further, the airflow 46 jetted out from the air jet opening 30, after colliding with the surface of the Si wafer 14, has a part flowing out to the peripheral side of the Si wafer 14 and the rest flowing to the inside. Therefore, the residual gas generated at the time of etching is prevented from moving to the peripheral side by the airflow 46 so as to stay in the region opposing the exhaust vent 28. As a result, part of the residual gas which part has escaped being sucked into the exhaust vent 28 is certainly prevented from flowing out to the periphery, while another part of the residual gas which part has passed below the exhaust vent 28 is also pushed back to the region opposing the exhaust vent 28 to be sucked thereinto. Thus, the airflow 46 jetted out from the air jet opening 30 prevents the residual gas generated at the time of etching from flowing out into the etching chamber 12a.

Therefore, it is ensured in the plasma etching apparatus 10 that reduction in the rate of etching and contamination and generation of dust in the etching chamber 12a due to the deposition of a reaction byproduct caused by the outflow of the residual gas at the time of etching into the etching chamber 12a is prevented.

Further, inside the nozzle 20A, which is shaped like an overturned cone in appearance, the inner pipeline 20a communicating with the gas spray opening 26 is arranged in the center, the exhaust path 32 is formed annularly to surround the periphery of the inner pipeline 20a, and the air supply path 38 is formed annularly to surround the periphery of the exhaust path 32. Therefore, the nozzle 20A has the triple structure of the inner pipeline 20a, the exhaust path 32, and the air supply path 38 that are formed concentrically, and thus is compact in configuration.

Further, the suction pipeline 33 and the airline 40 are connected, respectively, to a plurality of connection openings 32a and a plurality of connection openings 38a formed on the upper face of the nozzle 20A. In FIG. 2(A), only two of the connection openings 32a and as many connection openings 38a are shown. However, the connection openings 32a and 38a are provided to communicate, each at two points or more, with the annularly formed exhaust path 32 and air supply path 38, respectively, so that pressure is generated evenly in the entire exhaust path 32 by suction and in the entire air supply path 38 by airflow.

Figure 3A:
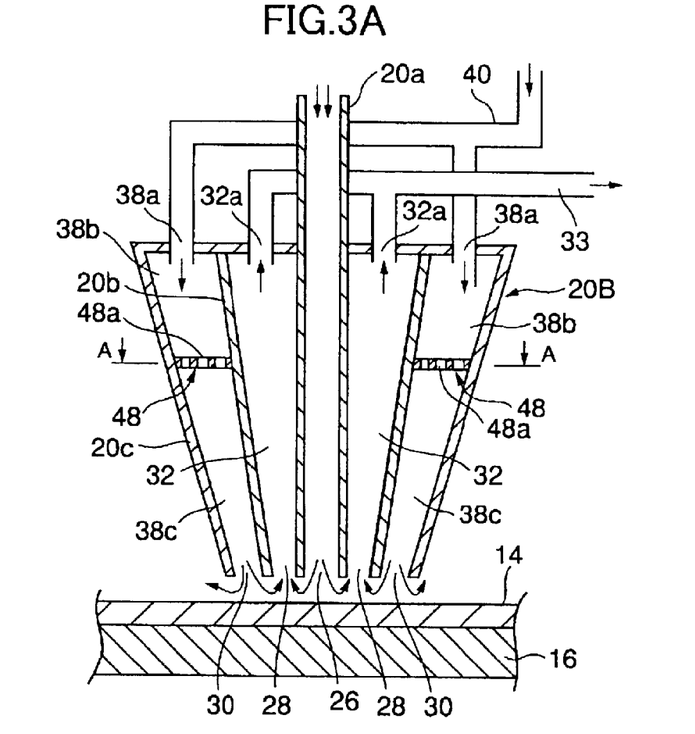
FIG. 3A is a longitudinal sectional view of a nozzle of the plasma etching apparatus of FIG. 1 according to a second embodiment of the present invention, showing the internal structure of the nozzle.
Figure 3B:
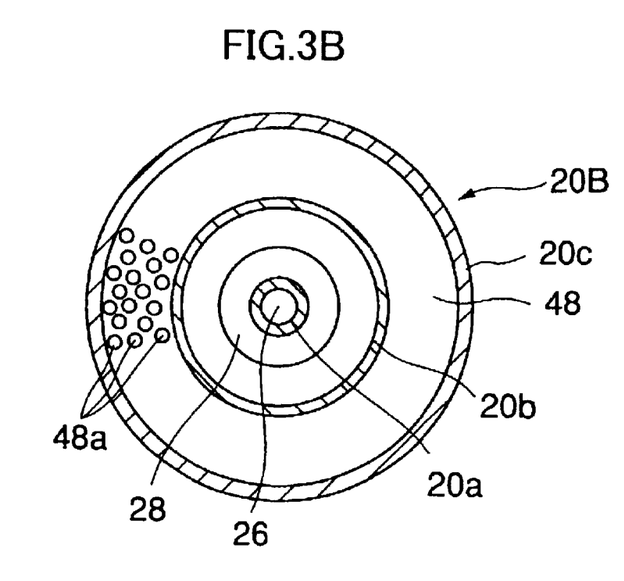
FIG. 3B is a sectional view of the nozzle of FIG. 3A taken along the line A—A.

FIGS. 3A and 3B are diagrams showing a nozzle 20B according to a second embodiment of the present invention. FIG. 3A is a longitudinal sectional view of the nozzle 20B, showing an internal structure thereof, and FIG. 3B is a sectional view of the nozzle 20B of FIG. 3A taken along the line A—A. In FIGS. 3A and 3B, the same elements as those of the first embodiment are referred to by the same numerals, and a description thereof will be omitted.

As shown in FIGS. 3A and 3B, the nozzle 20B includes a baffle board (airflow control member) 48 that partitions the air supply path 38 into an upper chamber 38b and a lower chamber 38c. The baffle board 48 is formed into an annular shape corresponding to the size and shape of the air supply path 38 so as to disperse the gas supplied from the airline 40 evenly in the entire air supply path 38. Further, a large number of through holes 48a small in diameter are formed in the baffle board 48 so as to communicate with the upper chamber 38b and the lower chamber 38c.

Therefore, the gas supplied from the airline 40, in the process of passing through the through holes 48a from the upper chamber 38b to the lower chamber 38c, has its flow controlled so that the pressure is distributed evenly in the entire annular air supply path 38. Thereby, the airflow 46 jetted out from the air jet opening 30 is allowed to form the air curtain around the periphery of the exhaust vent 28 at a substantially uniform pressure so as to evenly form a shield around the periphery of the exhaust vent 28.

Therefore, it is ensured that reduction in the rate of etching and contamination and generation of dust in the etching chamber 12a due to the deposition of a reaction byproduct caused by the outflow of the residual gas at the time of etching into the etching chamber 12a is prevented.

Figure 4:
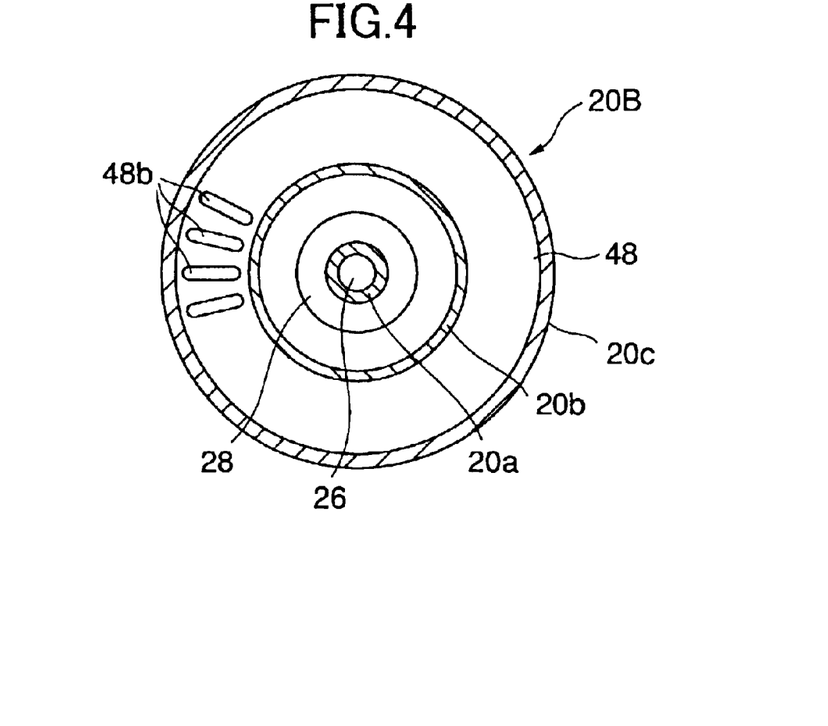
FIG. 4 is a sectional view of a first variation of a baffle board of the nozzle of FIG. 3A taken along the line A—A.

FIG. 4 is a sectional view of a first variation of the baffle board 48 of FIG. 3A taken along the line A—A.

As shown in FIG. 4, elliptical through holes 48b may be formed in the baffle board 48 instead of the above-described numerous circular through holes 48a of a small diameter. The elliptical through holes 48b may be replaced by rectangular or oval through holes.

Figure 5:
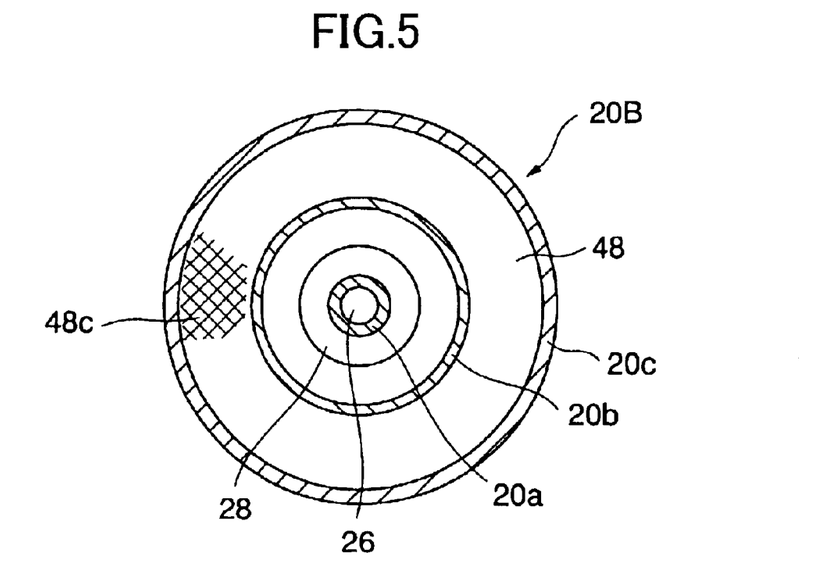
FIG. 5 is a sectional view of a second variation of the baffle board of the nozzle of FIG. 3A taken along the line A—A.

FIG. 5 is a sectional view of a second variation of the baffle board 48 of FIG. 3A taken along the line A—A.

As shown in FIG. 5, the baffle board 48 may be formed of a plurality of wire meshes 48c of a given mesh type superimposed one over another. In this case, by selecting the mesh type of the wire meshes 48c or changing the number of the wire meshes 48c, the effect of airflow control is optimized based on the air supply pressure.

By providing the baffle board 48, the airflow 46 is stably supplied to be jetted out between the nozzle 20B and the Si wafer 14.

Figure 6A:
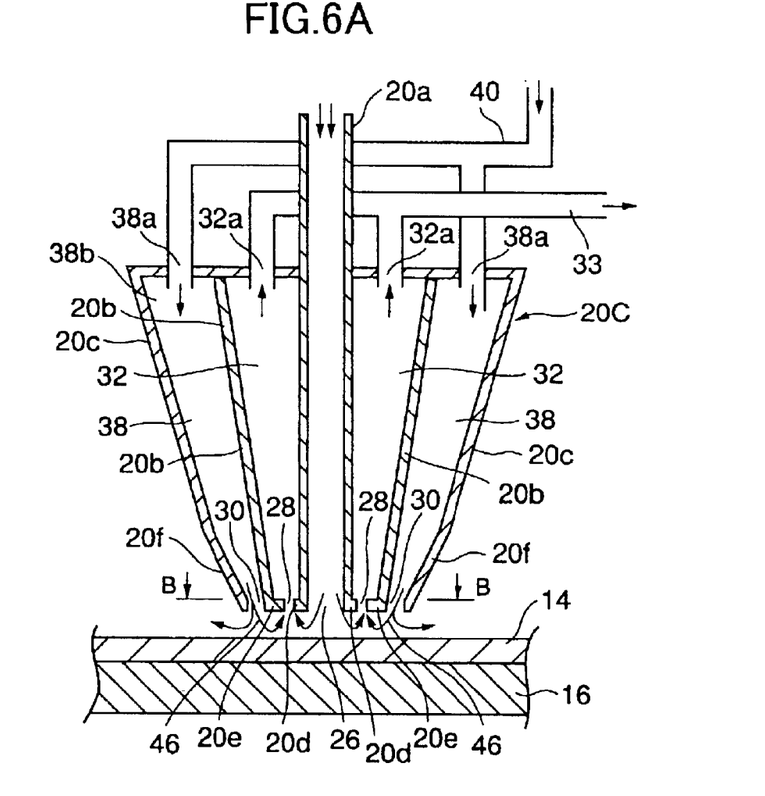
FIG. 6A is a longitudinal sectional view of a nozzle of the plasma etching apparatus of FIG. 1 according to a third embodiment of the present invention, showing an internal structure of the nozzle.
Figure 6B:
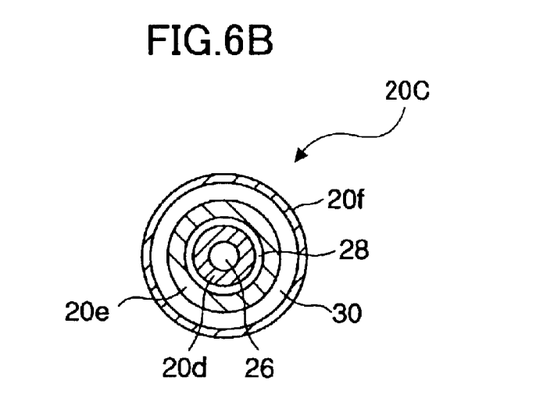
FIG. 6B is a sectional view of the nozzle of FIG. 6A taken along the line B—B.

FIGS. 6A and 6B are diagrams showing a nozzle 20C according to a third embodiment of the present invention. FIG. 6A is a longitudinal sectional view of the nozzle 20C, showing an internal structure thereof, and FIG. 6B is a sectional view of the nozzle 20C of FIG. 6A taken along the line B—B. In FIGS. 6A and 6B, the same elements as those of the first and second embodiments are referred to by the same numerals, and a description thereof will be omitted.

As shown in FIGS. 6A and 6B, planes 20d and 20e are annularly formed on the inner side and the outer side, respectively, inside the exhaust vent 28 of the nozzle 20C. The plane 20d formed on the inner side inside the exhaust vent 28 functions as a guide for leading the residual gas generated at the time of etching to the exhaust vent 28. The plane 20e formed on the outer side inside the exhaust vent 28 functions as a guide for leading the airflow 46 jetted out from the air jet opening 30 to the exhaust vent 28.

Further, in the nozzle 20C, a tapered end part 20f of the outer pipeline 20c forming the air jet opening 30 is narrowed (reduced in diameter) to have a greater angle of inclination, so that the area of the air jet opening 30 is reduced. Therefore, the airflow 46 is accelerated by the angle of inclination of the tapered end part 20f to be jetted out forcefully from the air jet opening 30 against the surface of the Si wafer 14. Further, the airflow 46 is jetted out along the angle of inclination of the tapered end part 20f from the air jet opening 30. Therefore, the airflow 46 is jetted out toward the inside so as to keep pressure, thereby preventing the residual gas generated at the time of etching from flowing out to the periphery of the Si wafer 14.

Figure 7:
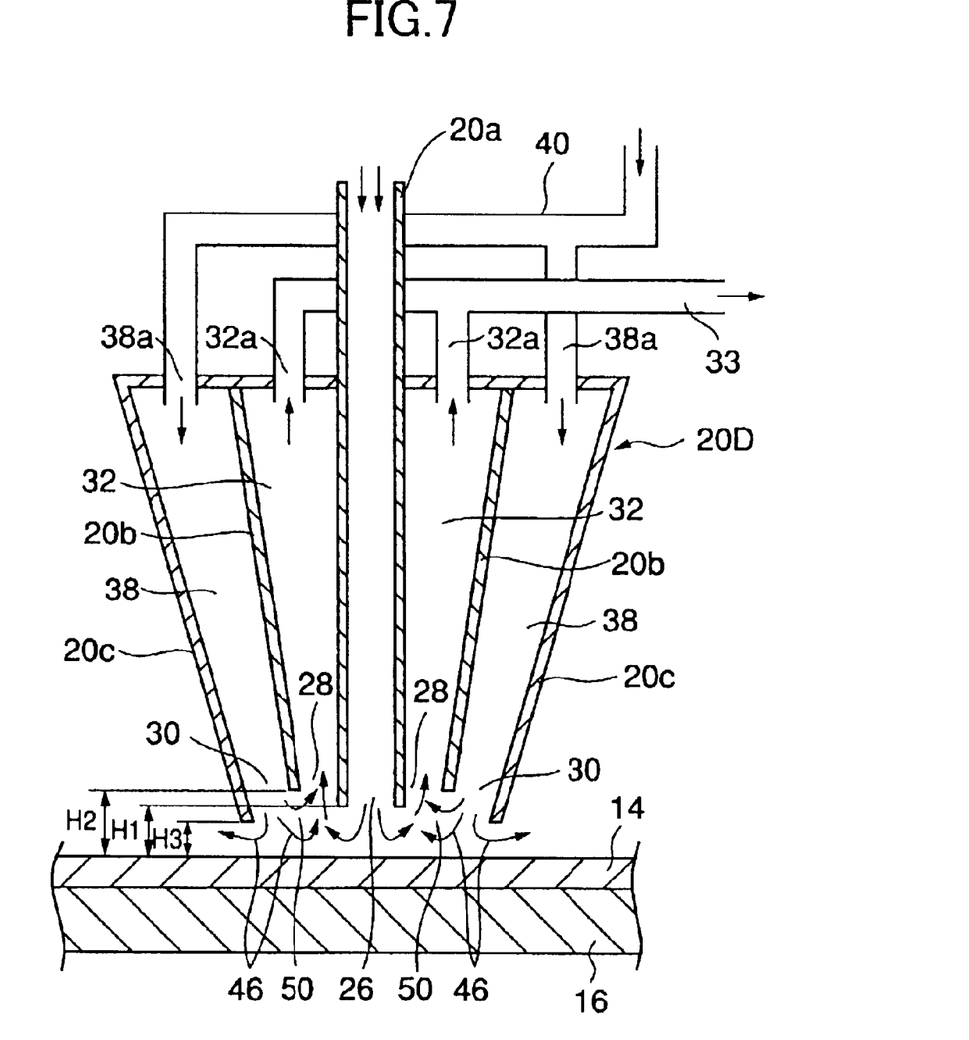
FIG. 7 is a longitudinal sectional view of a nozzle of the plasma etching apparatus of FIG. 1 according to a fourth embodiment of the present invention, showing the internal structure of the nozzle.

FIG. 7 is a longitudinal sectional view of a nozzle 20D according to a fourth embodiment of the present invention, showing an internal structure thereof. In FIG. 7, the same elements as those of the first through third embodiments are referred to by the same numerals, and a description thereof will be omitted.

As shown in FIG. 7, the nozzle 20D has the gas spray opening 26, the exhaust vent 28, and the air jet opening 30 formed at different vertical positions. The vertical positions of the gas spray opening 26, the exhaust vent 28, and the air jet opening 30 are provided so that the distance H1 between the gas spray opening 26 and the surface of the Si wafer 14, the distance H2 between the exhaust vent 28 and the surface of the Si wafer 14, and the distance H3 between the air jet opening 30 and the Si wafer 14 satisfy H3<H1<H2. That is, the middle pipeline 20b forming the exhaust path 32 is formed to be the shortest, and the outer pipeline 20c forming the air supply path 38 is formed to be the longest.

Accordingly, in the nozzle 20D, since the exhaust vent 28 is positioned higher than the gas spray opening 26, the residual gas generated at the time of etching is more likely to stay in space 50 opposing the exhaust vent 28, thereby increasing exhaust efficiency. Further, in the nozzle 20D, since the air jet opening 30 is positioned lower than the gas spray opening 26 and the exhaust vent 28, the inner wall of the air jet opening 30 makes it difficult for the residual gas generated at the time of etching to flow out to the periphery, and further, pressure is kept by the airflow 46 jetted out from the air jet opening 30. Thereby, the residual gas generated at the time of etching is prevented from flowing out to the periphery.

Further, in the nozzle 20D, since the middle pipeline 20b is shorter than the inner pipeline 20a and the outer pipeline 20c, the space 50 for the residual gas generated at the time of etching to stay in is formed between the end of the inner pipeline 20a and the end of the outer pipeline 20c. Therefore, the residual gas generated at the time of etching stays in the space 50 and is sucked efficiently into the exhaust vent 28, while prevented from flowing out to the periphery by the inner wall of the air jet opening 30 and the airflow 46 jetted out from the air jet opening 30.

Figure 8:
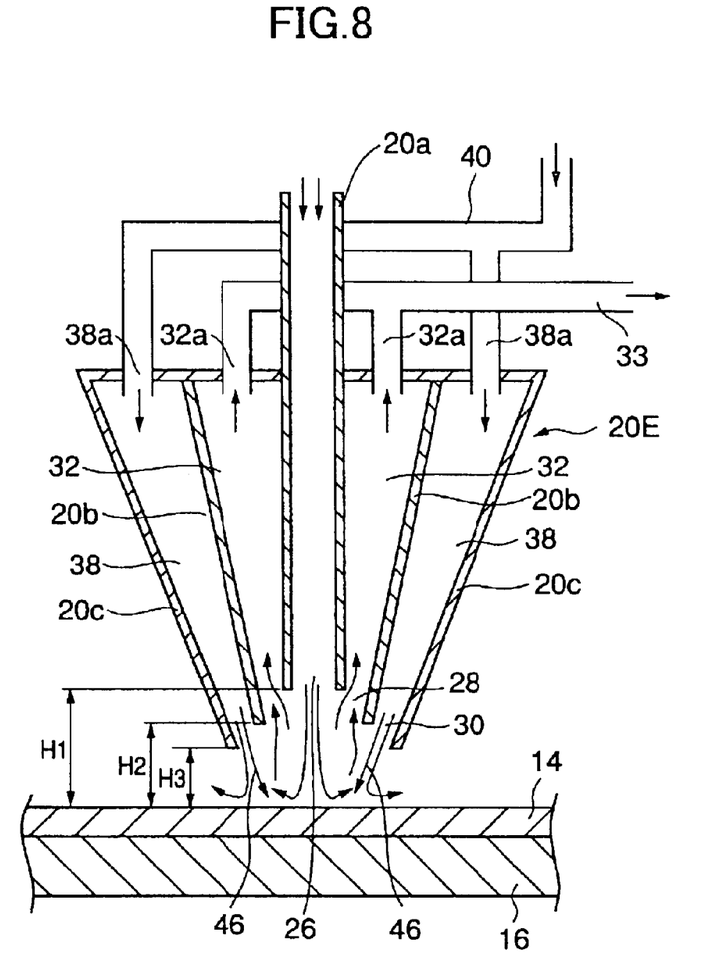
FIG. 8 is a longitudinal sectional view of a nozzle of the plasma etching apparatus of FIG. 1 according to a fifth embodiment of the present invention, showing an internal structure of the nozzle.

FIG. 8 is a longitudinal sectional view of a nozzle 20E according to a fifth embodiment of the present invention, showing an inner configuration thereof. In FIG. 8, the same elements as those of the first through fourth embodiments are referred to by the same numerals, and a description thereof will be omitted.

As shown in FIG. 8, the nozzle 20E has the gas spray opening 26, the exhaust vent 28, and the air jet opening 30 formed at different vertical positions. The vertical positions of the gas spray opening 26, the exhaust vent 28, and the air jet opening 30 are provided so that the distance H1 between the gas spray opening 26 and the surface of the Si wafer 14, the distance H2 between the exhaust vent 28 and the surface of the Si wafer 14, and the distance H3 between the air jet opening 30 and the Si wafer 14 satisfy H3<H2<H1. That is, the inner pipeline 20a forming the gas spray opening 26 is formed to be the shortest, and the outer pipeline 20c forming the air supply path 38 is formed to be the longest.

Accordingly, in the nozzle 20E, since the exhaust vent 28 is positioned lower than the gas spray opening 26, the residual gas generated at the time of etching is prone to flow into the exhaust vent 28, thereby increasing exhaust efficiency. Further, in the nozzle 20E, since the air jet opening 30 is positioned lower than the gas spray opening 26 and the exhaust vent 28, the inner wall of the air jet opening 30 makes it difficult for the residual gas generated at the time of etching to flow out to the periphery, and further, pressure is kept by the airflow 46 jetted out from the air jet opening 30. Thereby, the residual gas generated at the time of etching is prevented from flowing out to the periphery.

Further, in the nozzle 20E, since the middle pipeline 20b is longer than the inner pipeline 20a and the outer pipeline 20c is longer than the middle pipeline 20b, the exhaust vent 28 is formed below the gas spray opening 26 and the air jet opening 30 is formed below the exhaust vent 28. Therefore, the residual gas generated at the time of etching moves upward to be sucked efficiently into the exhaust vent 28, while prevented from flowing out to the periphery by the inner wall of the air jet opening 30 and the airflow 46 jetted out from the air jet opening 30.

Figure 9:
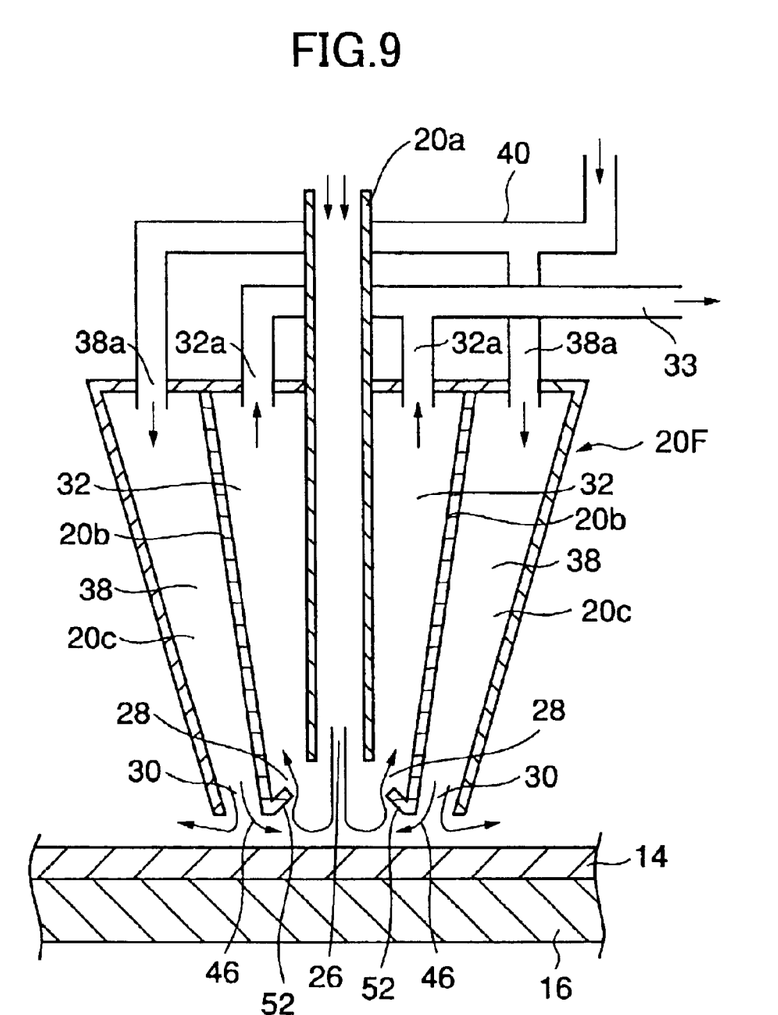
FIG. 9 is a longitudinal sectional view of a nozzle of the plasma etching apparatus of FIG. 1 according to a sixth embodiment of the present invention, showing an internal structure of the nozzle.

FIG. 9 is a longitudinal sectional view of a nozzle 20F according to a sixth embodiment of the present invention, showing an internal structure thereof. In FIG. 9, the same elements as those of the first through fifth embodiments are referred to by the same numerals, and a description thereof will be omitted.

As shown in FIG. 9, the nozzle 20F has the gas spray opening 26 formed at a position higher than the exhaust vent 28 and the air jet opening 30. Further, a tapered inclination part 52 is provided on the internal periphery of the exhaust vent 28. The tapered inclination part 52 functions as a guide to lead the residual gas generated at the time of etching upward into the exhaust vent 28.

Accordingly, the residual gas generated at the time of etching is prevented from flowing out to the periphery by the airflow 46 jetted out from the air jet opening 30. Further, the nozzle 20F enjoys increased exhaust efficiency since the residual gas generated at the time of etching is guided upward by the inclination part 52 to be sucked into the exhaust vent 28.

Figure 10:
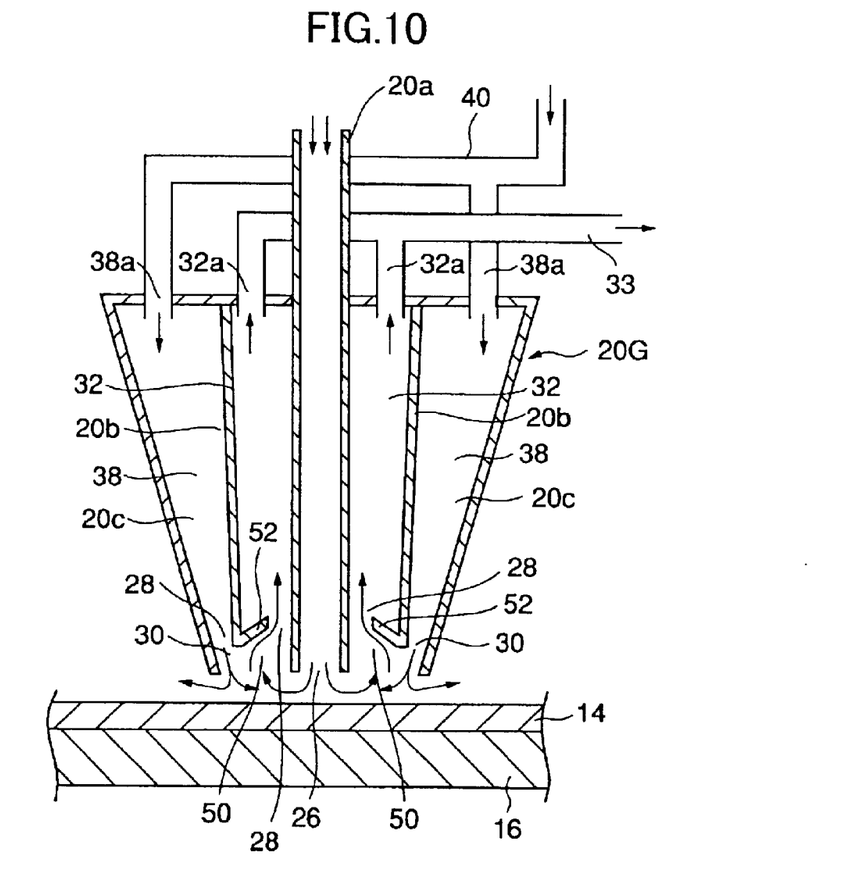
FIG. 10 is a longitudinal sectional view of a nozzle of the plasma etching apparatus of FIG. 1 according to a seventh embodiment of the present invention, showing the internal structure of the nozzle.

FIG. 10 is a longitudinal sectional view of a nozzle 20G according to a seventh embodiment of the present invention, showing an internal structure thereof. In FIG. 10, the same elements as those of the first through sixth embodiments are referred to by the same numerals, and a description thereof will be omitted.

As shown in FIG. 10, the nozzle 20G has the exhaust vent 28 formed at a position higher than the gas spray opening 26 and the air jet opening 30. Further, the tapered inclination part 52 functioning as a guide to lead the residual gas generated at the time of etching upward is provided on the inner periphery of the exhaust vent 28. The space 50 for the residual gas generated at the time of etching to stay in is formed below the inclination part 52.

Accordingly, the residual gas generated at the time of etching is prevented from flowing out to the periphery by the airflow 46 jetted out from the air jet opening 30, and is guided upward by the inclination part 52 to be sucked into the exhaust vent 28 after staying in the space 50. Therefore, the nozzle 20G enjoys increased exhaust efficiency.

Further, in the nozzle 20G, the middle pipeline 20b is not tapered but is straight. Therefore, the nozzle 20G can be formed with facility.

The gas spray opening 26, the exhaust vent 28, and the air jet opening 30, which are formed integrally with one another in the above-described embodiments, may be provided separately from one another.

In each of the above-described embodiments, the description is given of the case where the surface of the Si wafer 14 is etched, while the present invention is also applicable to etching of a substrate formed of another material.

Types of gases sprayed from the gas spray opening 26 and the air jet opening 30 are not limited to those described in the above-described embodiments, but are selected as required.

In each of the above-described embodiments, the description is given of the case of the plasma etching device 10, while the present invention is also applicable to a process of forming a film on the surface of a substrate by spraying a process gas in a plasma state from the gas spray opening of a spray nozzle onto the surface of the substrate, such as a plasma CVD process.

The present invention is not limited to the specifically disclosed embodiments, but variations and modifications may be made without departing from the scope of the present invention.

The present application is based on Japanese priority application No. 2001-289013 filed on Sep. 21, 2001, the entire contents of which are hereby incorporated by reference.

What is claimed is:

1. A plasma processing apparatus processing a surface of a substrate by spraying a process gas in a plasma state from a gas spray opening of a spray nozzle onto the substrate, the plasma processing apparatus comprising: an exhaust opening for exhausting residual gas generated at a time of processing the surface of the substrate, the exhaust opening being provided at a position close to a periphery of the gas spray opening; and an air jet opening generating airflow, the air jet opening being provided surrounding said exhaust opening so as to prevent the residual gas from flowing out, wherein the spray nozzle has the gas spray opening, said exhaust opening, and said air jet opening formed concentrically on an end of the spray nozzle.

2. The plasma processing apparatus as claimed in claim 1, further comprising: a gas supply path communicating with the gas spray opening; an exhaust path annularly formed to surround a periphery of said gas supply path and communicating with said exhaust opening; and an air supply path annularly formed to surround a periphery of said exhaust path and communicating with said air jet opening.

3. The plasma processing apparatus as claimed in claim 2, wherein the spray nozzle has said gas supply path, said exhaust path, and said air supply path formed concentrically inside the spray nozzle.

4. The plasma processing apparatus as claimed in claim 2, further comprising an airflow control member controlling the airflow supplied to said air jet opening, the airflow control member being provided in said air supply path.

5. The plasma processing apparatus as claimed in claim 4, wherein said airflow control member has an annular shape corresponding to a size and a shape of said air supply path.

6. The plasma processing apparatus as claimed in claim 4, wherein said airflow control member controls the airflow so that pressure is distributed evenly in said air supply path.

7. The plasma processing apparatus as claimed in claim 6, wherein said airflow control member divides said air supply path into first and second parts, and includes a plurality of through holes communicating with the first and second parts.

8. The plasma processing apparatus as claimed in claim 7, wherein each of said through holes has a circular cross section.

9. The plasma processing apparatus as claimed in claim 7, wherein each of said through holes has an elliptical cross section.

10. The plasma processing apparatus as claimed in claim 7, wherein each of said through holes has a rectangular cross section.

11. The plasma processing apparatus as claimed in claim 7, wherein each of said through holes has an oval cross section.

12. The plasma processing apparatus as claimed in claim 6, wherein said airflow control member is formed of a plurality of wire meshes of a given mesh type.

13. The plasma processing apparatus as claimed in claim 2, wherein an end part of said air supply path on which end part said air jet opening is formed is tapered so that the airflow is accelerated by the taper of the end part to be jetted out from said air jet opening.

14. The plasma processing apparatus as claimed in claim 1, wherein the gas spray opening, said exhaust opening, and said air jet opening are arranged at different vertical positions.

15. The plasma processing apparatus as claimed in claim 14, wherein a distance between the gas spray opening and the surface of the substrate is smaller than a distance between said exhaust opening and the surface of the substrate and is greater than a distance between said air jet opening and the surface of the substrate.

16. The plasma processing apparatus as claimed in claim 14, wherein a distance between said exhaust opening and the surface of the substrate is smaller than a distance between the gas spray opening and the surface of the substrate and is greater than a distance between said air jet opening and the surface of the substrate.

17. The plasma processing apparatus as claimed in claim 14, wherein a distance between the gas spray opening and the surface of the substrate is greater than a distance between said exhaust opening and the surface of the substrate and a distance between said air jet opening and the surface of the substrate.

18. The plasma processing apparatus as claimed in claim 17, further comprising a guide plane formed between the gas spray opening and said exhaust opening so as to lead the airflow jetted out from said air jet opening to said exhaust opening.

19. The plasma processing apparatus as claimed in claim 18, wherein said guide plane is formed on said exhaust opening to have an inclination to the surface of the substrate.

20. The plasma processing apparatus as claimed in claim 14, wherein a distance between said exhaust opening and the surface of the substrate is greater than a distance between the gas spray opening and the surface of the substrate and a distance between said air jet opening and the surface of the substrate.

21. The plasma processing apparatus as claimed in claim 20, further comprising a guide plane formed between the gas spray opening and said exhaust opening so as to lead the airflow jetted out from said air jet opening to said exhaust opening.

22. The plasma processing apparatus as claimed in claim 21, wherein said guide plane is formed on said exhaust opening to have an inclination to the surface of the substrate.

23. The plasma processing apparatus as claimed in claim 1, further comprising a guide plane formed between the gas spray opening and said exhaust opening so as to lead the airflow jetted out from said air jet opening to said exhaust opening.

* * * * *